US006938194B2

(12) United States Patent
Prunier

(10) Patent No.: US 6,938,194 B2
(45) Date of Patent: Aug. 30, 2005

(54) INTEGRATED CIRCUIT TESTING METHOD AND SYSTEM

(75) Inventor: Jacques Prunier, Sassenage (FR)

(73) Assignee: STMicroelectronics S.A., Montrouge (FR)

(*) Notice: Subject to any disclaimer, the term of this patent is extended or adjusted under 35 U.S.C. 154(b) by 446 days.

(21) Appl. No.: 10/083,714

(22) Filed: Feb. 26, 2002

(65) Prior Publication Data

US 2002/0120893 A1 Aug. 29, 2002

(30) Foreign Application Priority Data

Feb. 26, 2001 (FR) .............................................. 01 02584

(51) Int. Cl.⁷ .............................................. G01R 31/28
(52) U.S. Cl. ........................ 714/724; 714/727; 714/733; 714/745; 324/763
(58) Field of Search ................................ 714/724, 727, 714/733, 745, 699; 324/763

(56) References Cited

U.S. PATENT DOCUMENTS

| 5,166,604 A | * | 11/1992 | Ahanin et al. .............. 324/763 |
| 5,285,153 A | | 2/1994 | Ahanin et al. |
| 5,467,354 A | | 11/1995 | Yamauchi |
| 5,574,731 A | | 11/1996 | Qureshi |
| 6,510,534 B1 | * | 1/2003 | Nadeau-Dostie et al. ... 714/724 |

* cited by examiner

*Primary Examiner*—Albert Decady
*Assistant Examiner*—John P. Trimmings
(74) *Attorney, Agent, or Firm*—Lisa K. Jorgenson; William R. McClellan; Wolf, Greenfield & Sacks, P.C.

(57) ABSTRACT

A system for testing an integrated circuit, the integrated circuit including: flip-flops connected to a logic block and the test system including circuitry for connecting the flip-flops as a register, circuitry for inhibiting the different elements of the logic block capable of disturbing the sequencing of the register or the propagation of the signals into the logic block, and a control circuit for separately controlling the different inhibiting circuits and the circuitry for connecting the flip-flops as a register.

26 Claims, 6 Drawing Sheets

INTEGRATED CIRCUIT TESTING METHOD AND SYSTEM

BACKGROUND OF THE INVENTION

1. Field of the Invention

The present invention relates to an improved method and system for functionally testing an integrated circuit.

2. Discussion of the Related Art

In a functional testing, it is checked whether an integrated circuit performs the functions for which it has been designed. Predetermined signals are provided to the inputs of the circuit or of determined circuit blocks and the outputs are read to determine whether they correspond to an expected answer. To test all the possible errors of an integrated circuit, a first approach consists of providing the integrated circuit with all the possible combinations of input states and of checking all the signals provided as a response by the circuit This, however, can take a long time. Error models enable determining the test signals (or test vectors) most adapted to testing a circuit.

A so-called scan test method, applied to a logic block of an integrated circuit, having each of its inputs connected to an output terminal of a flip-flop and each of its outputs connected to an input terminal of a flip-flop, will more specifically be considered herein A scan test system includes means for controlling the writing and the reading of test signals in said flip-flops.

FIG. 1 schematically shows a scan test system associated with an integrated circuit including a combinatorial logic block, or logic block LB. The circuit includes three flip-flops FF1, FF2, and FF3. Input and output terminals D1 and Q1 of flip-flop FF1 are respectively coupled to an output terminal O1 and to an input terminal I1 of block LB. Similarly, the input and output terminals D2, Q2, and D3, Q3 of flip-flops FF2 and FF3 are respectively coupled to output and input terminals O2, I2, and O3, I3 of block LB. Clock terminals CK1, CK2, and CK3 of flip-flops FF1, FF2, and FF3 receive a same clock signal CLK. Flip-flops FF1, FF2, and FF3, as well as logic block LB, form the functional part of the circuit The circuit test system includes multiplexers Mi (where i ranges between 1 and 3), each associated with the flip-flop FFi of the same rank. The output terminal of each multiplexer Mi is connected to the input Di of same r A fast input terminal of each multiplexer Mi is connected to output terminal Oi of block LB. A control terminal of each multiplexer Mi receives a signal SC. The second input terminal of multiplexer M1 is connected to an input terminal SI of the circuit The second input terminals of multiplexers M2 and M3 are respectively connected to output terminals Q1 and Q2 of flip-flops FF1 and FF2. Terminal Q3 of flip-flop FF3 is connected to an output terminal SO of the circuit.

Outside of test periods, signal SC is inactive and multiplexers Mi are controlled so that outputs Oi of the logic block are connected to inputs Di of flip-flops FFi. When signal SC is active, multiplexers Mi are controlled so that flip-flops FFi form a FIFO-type test register rated by clock signal CLK.

FIG. 2 schematically illustrates the operation of the test system of FIG. 1.

In a first step, signal SC is maintained active so that flip-flops FF1, FF2, and FF3 form the test register. Test data TD3, TD2, and TD1 are successively presented to SI at the rate of pulses of clock signal CLK, at times t1, t2, and t3. At time t3, data TD3, TD2, and TD1 are respectively stored in flip-flops FF3, FF2, and FF1. Data TD3', TD2', and TD1' are then presented on output terminals O3, O2, and O1 of logic block LB.

In a second step, after time t3, signal SC is made inactive so that the multiplexers connect output terminals O3, O2, and O1 of the logic block to input terminals D3, D2, and D1 of the flip-flops. At the next pulse of signal CLK, at a time t4, data TD3', TD2', and TD1' are stored in flip-flops D3, D2, and D1. Signal SC is made active again after time t4.

In a third step, starting from the reactivation of signal SC, data TD3', TD2', and TD1' are shifted in the test register at the rate of pulses of clock signal CLK, at times t5 and t6, and are successively provided to terminal SO. During this shift, a new test vector TD6, TD5, TD4 is input in the register. Data TD3', TD2', and TD1' provided to terminal SO are compared with their expected values, generally logic "0s" or "1s".

These three steps are repeated many times as test vectors have been provided. The analysis of the data provided by the logic block as a response to the test data, collected during each third step, enables determining whether the circuit includes defective elements. A defective element is, according to the error model conventionally used, an element having an output abnormally fixed to 0 or to 1. Such a test system operates satisfactorily if the logic block includes no element capable of disturbing the operation of the test register, or to disturb the propagation of the signals in the logic block. Even if such disturbing elements exist, existing test systems are adapted to inhibiting them.

FIG. 3 schematically shows a test system for an integrated circuit similar to the circuit shown in FIG. 1, in which three types of disturbing elements have been inserted.

A first disturbing element is an AND gate 2, a first input of which receives clock signal CLK, the second input of which is coupled to a clock enable signal EN1 generated in block LB, and the output of which is connected to terminal CK2. Gate 2 is capable of disturbing the sequencing of the test register, if for example data provided to block LB cause the inactivation of signal EN1 and the blocking of flip-flop FF2. The flip-flop assembly can then no longer operate as a shift register during the test. To solve this type of problem and make the circuit testable, a solution provided in prior art consists of adding an OR gate 4, the output final of which is connected to the second input terminal of AND gate 2, a first input terminal of which receives clock enable signal EN1, and a second input terminal of which receives a control signal TEST. When the circuit is not tested, signal TEST is made inactive, gate 4 transmits signal EN1 to gate 2 without influencing the circuit operation. When the circuit is tested, signal TEST is activated, the output of gate 4 remains activated whatever signal EN1, and gate 2 is no longer capable of disturbing the sequencing of the test register.

A second disturbing element is an element 5 which provides a reset signal RS to a reset terminal RST of flip-flop FF3 via an output terminal O5. Element 5 is capable of disturbing the sequencing of the test register, if for example test data provided to block LB cause the activation of signal RS and the resetting of flip-flop FF3. To make the circuit testable, a multiplexer 6 having an output terminal connected to terminal RST of flip-flop FF3 and a first input terminal connected to output O5 of the logic block has been added. A second input of multiplexer 6 receives a controllable signal TRST, for example permanently inactive. When the circuit is not tested, signal TEST is made inactive and multiplexer 6 transmits signal RS without influencing the circuit operator. When the circuit is tested, signal TEST is made active and multiplexer 6 permanently provides controllable signal TRST to terminal RST of flip-flop FF3. Thereby, block 5 is not capable of disturbing the sequencing of the test register.

A third disturbing element is a switch 8 capable of disturbing the propagation of a signal OD provided by block LB to output terminal O1. Terminal O1 is connected to a signal storage element 9 and switch 8 receives a signal EN2 generated by block LB. Switch 8 is capable of disturbing the circuit testing, especially during a second step of the testing, if test data provided to block LB cause the inactivation of signal EN2 and the opening of switch 8. Storage element 9 then provides the last value of the signal that it has received. The logic circuit is no longer combinatorial and it is no longer testable by scanning. To make the circuit testable, an OR gate 10, an output of which is connected to control switch 8, a first input terminal of which receives enable signal EN2, and a second input terminal of which receives signal TEST has been added. When the circuit is not tested, signal TEST is made inactive and gate 10 transmits signal EN2 to switch 8 without influencing the circuit operation. When the circuit is tested, signal TEST is made active, the output of gate 10 remains activated whatever signal EN2, and switch 8 remains closed and is no longer capable of disturbing the circuit testing.

When signal TEST is made active, the operation of the test system shown in FIG. 3 is similar to the operation illustrated in FIG. 2 of the test system of FIG. 1.

A disadvantage of the test system of FIG. 3 is that it does not enable testing the proper operation of elements 2, 5, and 8 inhibited by inhibiting means 4, 6, and 10 of the test system. The testing of elements 2, 5, and 8 must then be performed by means of specific test vectors, without using the test system. As the size and complexity of integrated circuits increases, the number of disturbing elements becomes significant and it becomes difficult to provide all the necessary specific test vectors.

SUMMARY OF THE INVENTION

An object of the present invention is to provide a test system and method enabling testing of as many elements of an integrated circuit as possible.

For this purpose, the present invention provides a scan test system provided with means for testing the elements disturbing the test.

To achieve this and other objects, the present invention provides a system for testing an integrated circuit, the integrated circuit including flip-flops connected to a logic block and the test system including means for connecting the flip-flops as a register, means for inhibiting the different elements of the logic block capable of disturbing the sequencing of the register or the propagation of the signals into the logic block and a control means for separately controlling the different means of inhibition of said elements of the logic block and the means for connecting the flip-flops as a register.

According to an embodiment of the present invention, said elements of the logic block are of several types, and the control means is provided to control together the means of inhibition of the elements of a same type.

According to an embodiment of the present invention, elements of a first type condition the clock signal provided to at least one flip-flop.

According to an embodiment of the present invention, elements of a second type condition a reset signal provided to at least one flip-flop.

According to an embodiment of the present invention, elements of a third type include locking elements capable of preventing the propagation of at least one signal into the logic block.

The present invention also aims at a method for testing an integrated circuit including flip-flops connected to a logic block, especially including the steps of:

a) connecting the flip-flops as a register and inhibiting the elements of the logic block capable of disturbing the register sequencing, these elements being gathered in sets of elements of same type, then writing a test vector into the register, b) reactivating a set of elements, then clocking the flip-flops, and c) inhibiting again the set of reactivated elements before sequentially reading the data contained in the register.

According to an embodiment of the present invention, step b) also includes deactivating the register connection of the flip-flops before clocking the flip-flops, and step c) also includes reactivating the register connection of the flip-flops before sequentially wading the data contained in the register.

The foregoing objects, features and advantages of the present invention, will be discussed in detail in the following non-limiting description of specific embodiments in connection with the accompanying drawings.

DETAILED DESCRIPTION

Figure 3:
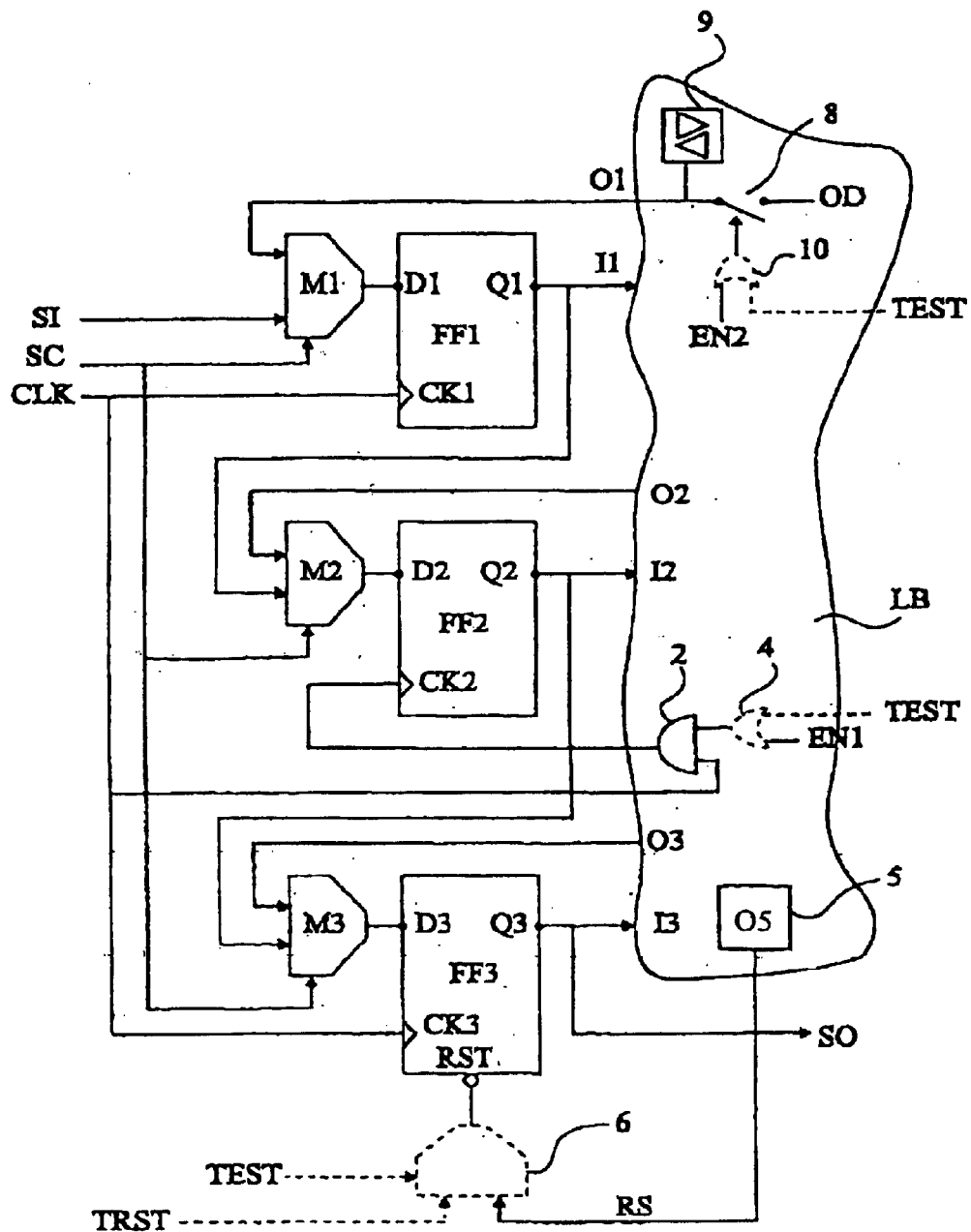
FIG. 3, previously described, schematically shows a conventional integrated circuit scan test system including elements disturbing the test system.
Figure 4:
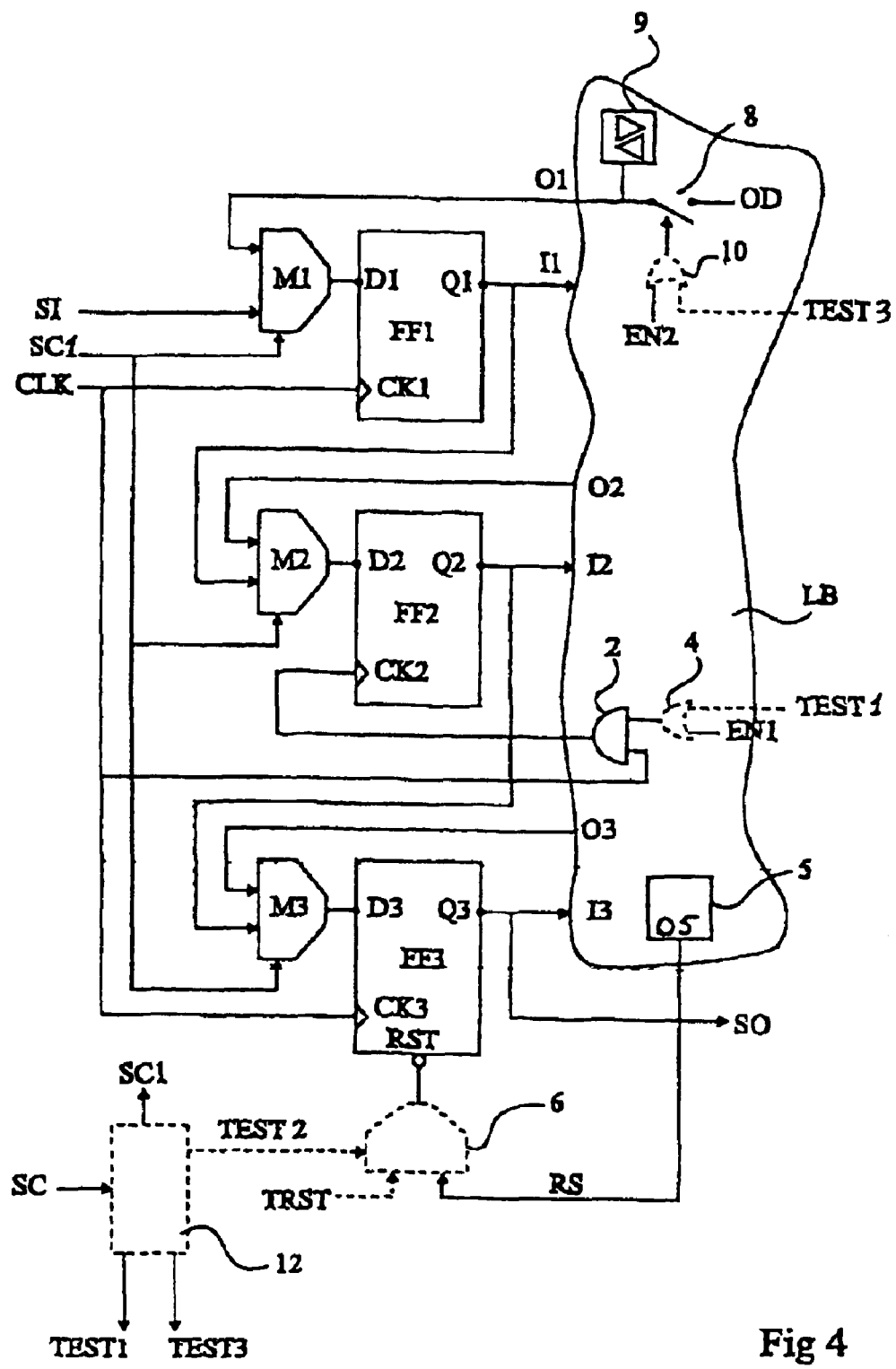
FIG. 4 schematically shows an embodiment of a test system according to the present invention.

FIG. 4 schematically shows a scan test system according to the present invention, associated with an integrated circuit such as shown in FIG. 3. The test system includes multiplexers Mi and inhibiting means 4, 6, and 10, identical to the elements beating the same references in FIG. 3, connected in a similar way except for their control terminals. According to the present invention, each type of inhibiting means is controlled by a specific control signal. Inhibiting means 4, 6 and 10 respectively receive a control signal TEST1, TEST2, and TEST3 provided by a control means 12. Also according to the present invention, multiplexers Mi are controlled by a control signal SC1 provided by control means 12, which receives control signal SC. Control means 12 is provided to generate signals TEST1, TEST2, TEST3, and SC1 based on signal SC.

When idle, the test system according to the present invention has no influence upon the circuit operation.

According to a first operating mode, a control means 12 provides multiplexers Mi with a signal SC1 identical to signal SC and it maintains control signals TEST1, TEST2, and TEST3 active. Thus, inhibiting means 4, 6, and 10 are activated and the effect of the disturbing elements is inhibited. The operation of the test system is then similar to the operation of the test system of FIG. 3. This first operating mode enables performing a conventional scan test of the circuit. During this first operating mode, disturbing elements 2, 5, and 8 are not tested.

Figure 1:
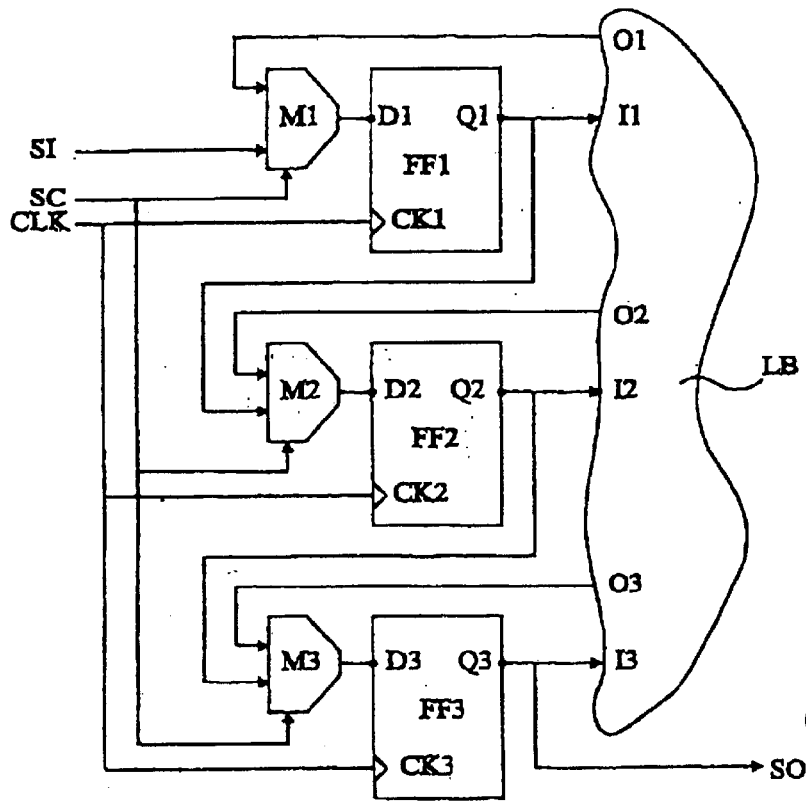
FIG. 1, previously described, schematically shows a conventional system for testing by scanning an integrated circuit.
Figure 2:
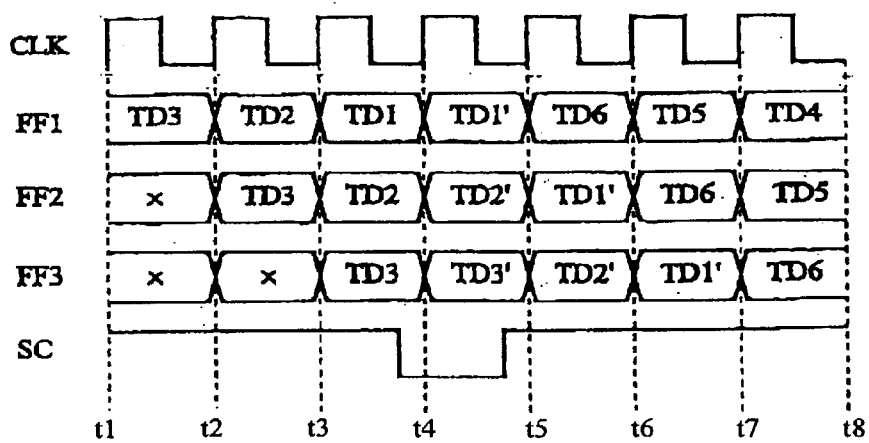
FIG. 2, previously described, illustrates the operation of the test system of FIG. 1.
Figure 5:
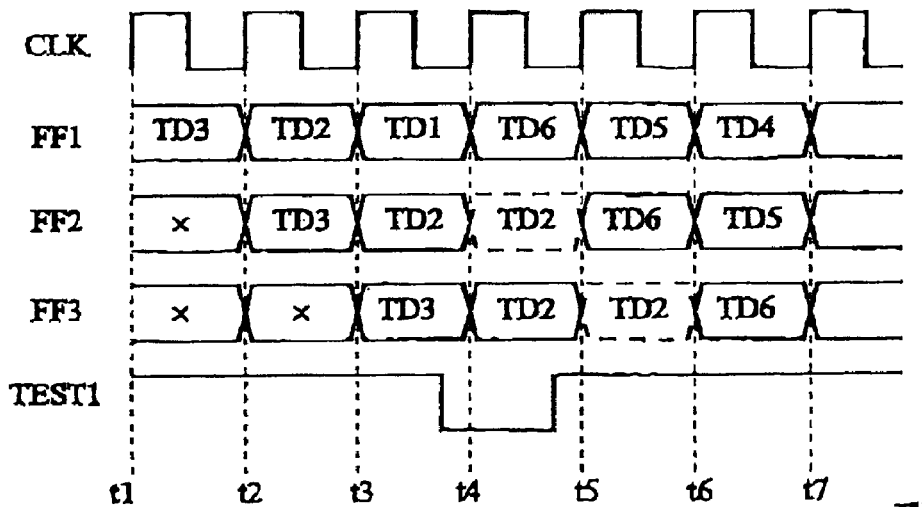
FIG. 5 illustrates the testing of a first disturbing element of the circuit of FIG. 4.
Figure 6:
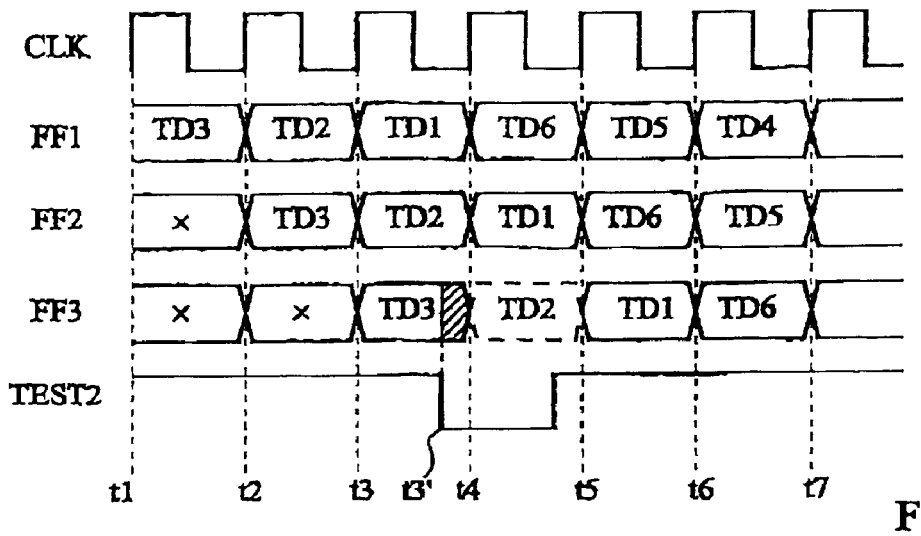
FIG. 6 illustrates the testing of a second disturbing element of the circuit of FIG. 4.
Figure 7:
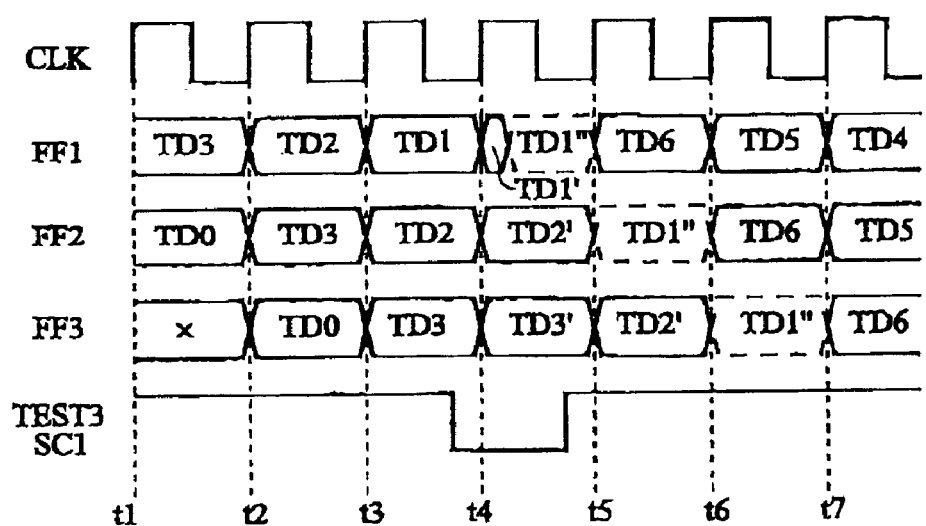
FIG. 7 illustrates the testing of a third disturbing element of the circuit of FIG. 4.

According to a second operating mode, illustrated by FIGS. 5, 6, and 7, control means 12 successively controls the testing of each disturbing element, especially by temporarily inhibiting the effects of the tested disturbing element, and by permanently inhibiting the effects of the other untested disturbing elements. For reasons of writing simplicity, references TD1 to TD6 and t1 to t6 already used in FIG. 2, but which represent different test data and times in the different drawings, are used in the following FIGS. 5, 6, and 7.

FIG. 5 illustrates the testing of disturbing element 2. During the entire testing duration, control signals TEST2, TEST3, and SC1 are maintained active, so that flip-flops FF1, FF2, and FF3 form the test register and that the effect of disturbing elements 5 and 8 is inhibited. Control signal TEST1 is equal to signal SC received by block 12.

In a first step, signal TEST1 is maintained active so that signal EN1 provided by block LB to element 2 is not capable of disturbing the sequencing of the test register. Test data TD3, TD2, and TD1 are successively presented to terminal SI at the rate of the pulses of clock signal CLK, at times t1, t2, and t3, so that data TD3, TD2, and TD1 are respectively stored in flip-flops FF3, FF2, and FF1 from time t3. The test vector corresponding to data TD3, TD2, and TD1 is chosen to give to logic block LB a state such that signal EN1 is normally active.

In a second step, a predetermined duration after time t3, signal TEST1 is made inactive so that gate 4 transmits signal EN1 to element 2. If element 2 or its connection exhibits an error and signal EN1 is inactive, instead of being active as it should be, flip-flop FF2 is not clocked at the next pulse of signal CLK, at a time t4. Datum TD2 then remains stored in flip-flop FF2 after time t4, while datum TD1 should have been input into flip-flop FF2.

In a third step, control signal TEST1 is made active again, a predetermined duration after time t4. The data contained in flip-flops FF1, FF2, and FF3 are shifted in the test register at the rate of the pulses of clock signal CLK, at times t5 and t6, and successively provided to terminal SO to be analyzed.

At times t4, t5, and t6, a new test vector TD6, TD5, and TD4 is input into the test register. This new test vector is chosen to give the logic block a state in which signal EN1 is normally inactive. The preceding second and third steps are then repeated to check that element 2 or its connection do not include an error at maintains signal EN1 active.

FIG. 6 illustrates the testing of disturbing element 5. Control signals TEST1, TEST3, and SC1 are maintained active, so that flip-flops FF1, FF2, and FF3 form the test register and the effect of disturbing elements 2 and 8 is inhibited. Control signal TEST2 is equal to signal SC received by block 12.

In a first step, signal TEST2 is maintained active so that signal RS provided by element 5 is not capable of disturbing the sequencing of the test register. Test data TD3, TD2, and TD1 are successively presented to terminal SI at the rate of pulses of clock signal CLK, at times t1, t2, and t3, so that data TD3, TD2, and TD1 are respectively stored in flip-flops FF3, FF2, and FF1 and provided to input terminals I3, I2, and I1 from time t3. Data TD3, TD2, and TD1 form a test vector intended for controlling the activation of signal RS by element 5. Thus, in a normal operation of the logic block, signal RS would cause a reset of the content of flip-flop FF3. During the first step, nothing occurs due to the presence of signal TEST2 in an active state.

In a second step, at a time t3' subsequent to time t3, control signal TEST2 is made inactive so that signal RS directly controls the reset terminal of flip-flop FF3. If element 5 or its connection includes an error that maintains signal RS inactive, flip-flop FF3 is not reset and datum TD3 remains stored in flip-flop FF3 during the period shown with hatchings in FIG. 6. Further, at the next pulse of signal CLK, which occurs at a time t4, datum TD2 is stored in flip-flop FF3 instead for flip-flop FF3 to remain reset. If signal RS is active, datum TD3 is replaced in flip-flop FF3 by a reset value and flip-flop FF3 remains reset after time t4.

In a third step, control signal TEST2 is made active again, a predetermined duration after time t4. At time t4 and at times t5 and t6 representing the next pulses of clock signal CLK, a new test vector TD6, TD5, and TD4 is input into the lest register. Vector TD6, TD5, and TD4 is chosen to give the logic block a state in which signal RS is deactivated by element 5. The preceding second step is then repeated to check that element 5 or its connection does not include an error that maintains signal RS active.

FIG. 7 illustrates the testing of disturbing element 8. Control signals TEST1 and TEST2 are maintained active so that the effect of disturbing elements 2 and 8 is not inhibited. Control signals TEST3 and SC1 are equal to signal SC received by block 12.

In a first step, control signal SC1 is made active so that flip-flops FF1, FF2, and FF3 form the test register Control signal TEST3 is also active, and the propagation of signal OD provided by block LB to terminal O1 is not capable of being disturbed by switch 8, whatever the value of signal EN2 provided to switch 8. Test data TD3, TD2, and TD1 are successively presented to terminal SI at the rate of pulses of clock signal CLK, at times t1, t2, and t3, so that data TD3, TD2, and TD1 are respectively stored in flip-flops FF3, FF2, and FF1 and provided to input I3, I2, and I1 from time t3. The data which are then presented on outputs O3, O2, and O1 of block LB are called TD3', TD2', and TD1'. Storage element 9 stores value TD1'.

In a second step, a predetermined duration after time t3, control signals TEST3 and SC1 are made inactive. Signal EN2 then directly controls switch 8 and the multiplexers connect output terminals O3, O2, and O1 of the logic block to input terminals D3, D2, and D1 of the flip-flops. At the next pulse of signal CLK, at a time t4, data TD3', TD2', and TD1' are stored in flip-flops D3, D2, and D1. Data TD3', TD2', and TD1' are then provided by the flip-flops to terminals I3, I2, and I1 of the logic block. The value taken by OD after time t4 is called TD1". Data TD3', TD2', and TD1' form a test vector chosen to give block LB a state in which signal EN2 is inactive and controls the opening of switch 8. If switch 8 or its connection have an error that maintains switch 8 closed, datum TD1" is provided to flip-flop FF1 after time t4, as illustrated. If switch 8 has no error and signal EN2 controls the opening of switch 8 at time t4, datum TD1" is not provided to flip-flop FF1, and flip-flop FF1 keeps datum TD1'.

In a third step, signals SC1 and TEST3 are made active again a predetermined duration after time t4. The data contained in flip-flops FF1, FF2, and FF3 are shifted in the test register at the rate of the pulses of clock signal CLK, at times t5 and t6, and successively provided to terminal SO.

At times t4, t5, and t6, a new test vector TD6, TD5, and TD4, for example chosen to give block LB a state in which signal EN2 is active, is input into the test register. The preceding second and third steps are then repeated to check that switch 8 is not maintained closed.

A test system according to the present invention thus enables testing the elements disturbing the scan test, which is a first advantage.

Block 12 generates signals TEST1, TEST2, TEST3, and SC1 based on signal SC. Thus, a test system according to the present invention enables testing the elements disturbing the scan test without using a large number of specific test terminals intended for each receiving one of signals TEST1, TEST2, TEST3, and SC1, which is an additional advantage of the present invention.

The shown circuit includes, as an example, a single disturbing element of each type. When a circuit includes several disturbing elements of same type, that is, each having a same effect on similar elements of the circuit, the present invention provides controlling the means for inhibiting these disturbing elements of same type with a same control signal provided by means 12. Such a control of the inhibiting means especially enables rapidly testing the disturbing elements by means of a small number of test vectors, which is an additional advantage of the present invention.

The control means, of simple structure, has a reduced size. Thus, a test system according to the present invention has substantially the same size as a conventional scan test system, which is an additional advantage of the present invention.

Further, since the present invention provides isolating the testing of each type of disturbing element, the test vectors used for each type of disturbing element can be generated automatically and rapidly by a calculator having a list of the circuit elements and of their connections. This is an additional advantage of the present invention.

Of course, the present invention is likely to have various alterations, modifications, and improvements which will really occur to those skilled in the art. Disturbing elements 2, 5, and 8 shown in FIG. 4 are shown as an example only. There are many steps of elements disturbing the scan test, generally known as "exceptions to the rules of scan testability", and those skilled in the art will easily adapt the present invention to the types of disturbing elements which have not been shown herein.

Figure 8:
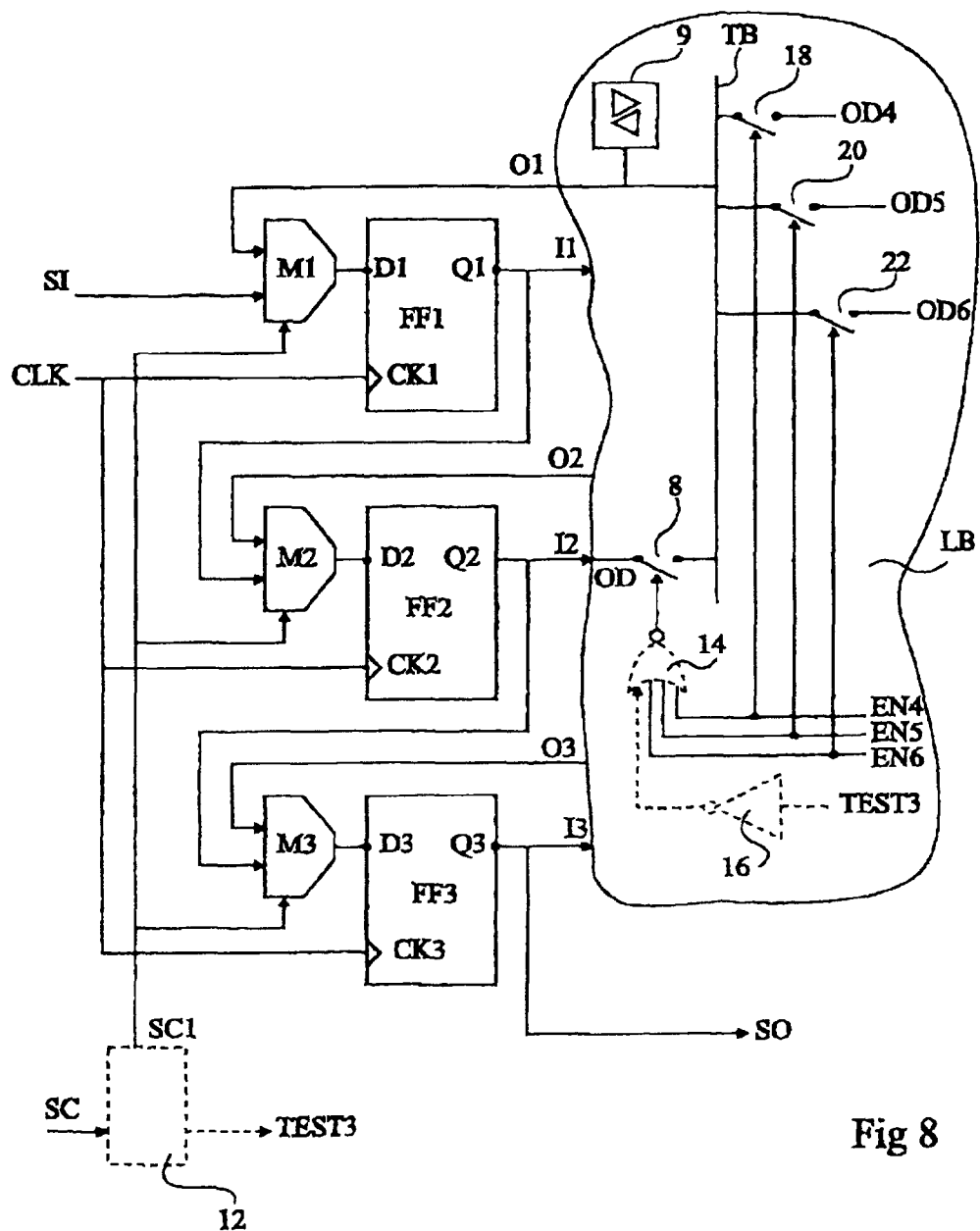
FIG. 8 schematically shows an embodiment of a test system according to the present invention.

FIG. 8 schematically shows an embodiment of a test system according to the present invention, adapted to the testing of a specific disturbing element 8. The preceding disturbing elements 2 and 5 have not been shown in FIG. 8. In FIG. 8, signal OD is directly provided by the output of flip-flop FF2, and terminal O1 and storage element 9 are connected to a three-state bus TB. Bus TB further receives signals OD4, OD5, OD6 via switches 18, 20, and 22. Switches 18, 20, and 22 receive signals EN4, EN5, EN6 from block LB. Switch 8 is controlled by a NOR gate receiving signals EN4, EN5, EN6 and the inverse of signal TEST3 as an input. When signal TEST3 is activated, terminal O1 is controlled either by signals OD4, OD5, OD6, or by flip-flop FF2, and the circuit remains combinatorial whatever the state of signals EN4, EN5, EN6.

The test steps and vectors of disturbing elements 2, 5, and 8 have also been described as an example, but those skilled in the art will easily adapt the present invention to other test steps and to other test vectors.

The present invention has been described in relation with a circuit including a single logic block and three flip:ops, but those skilled in the art will easily adapt the present invention to a circuit including a greater number of logic blocks and/or a greater number of flip-flops. If the circuit includes several logic blocks, each logic block may be tested separately.

Such alterations, modifications, and improvements are intended to be part of this disclosure, and are intended to be within the spirit and the scope of the present invention Accordingly, the foregoing description is by way of example only and is not intended to be limiting. The present invention is limited only as defined in the following claims and the equivalents thereto.

What is claimed is:

1. A system for testing an integrated circuit, the integrated circuit including flip-flops connected to a logic block and the test system including:

test means operable for connecting the flip-flops as a register, and a plurality of types of inhibition means, each type of inhibition means being operable for inhibiting one specific type of element of the logic block having a configuration that can disturb the sequencing of the register or the propagation of signals into the logic block, and control means having:

a first operating mode for operating the test means in synchronism with a command signal while operating continuously the inhibition means; and a second operating mode for operating inhibition means of a first of the plurality of types of inhibition means in synchronism with the command signal while operating continuously inhibition means of a type different than the first type and the test means, or for operating simultaneously the test means and inhibition means of a first of the plurality of types of inhibition means in synchronism with the command signal while operating continuously inhibition means of a type different than the first type.

2. The integrated circuit test system of claim 1, wherein elements of a first type condition a clock signal provided to at least one flip-flop.

3. The integrated circuit test system of claim 2, wherein said elements of the first type include means for activating or inactivating said clock signal.

4. The integrated circuit test system of claim 1, wherein elements of a second type condition a reset signal provided to at least one flip-flop.

5. The integrated circuit test system of claim 1, wherein elements of a third type include locking elements capable of preventing the propagation of at least one signal into the logic block.

6. Scan test circuitry in an integrated circuit having a logic block including elements capable of disturbing a scan test, comprising:

a plurality of flip-flops operable as a register in a scan test mode;

inhibiting circuits for inhibiting each of the disturbing elements of the logic block from disturbing a scan test; and a controller for successively controlling each of the inhibiting circuits individually during a scan test.

7. Scan test circuitry as defined in claim 6, wherein the controller is configured to load into the flip-flops, with all disturbing elements inhibited, a test vector for testing a first disturbing element and, subsequently, to enable the first disturbing element and to observe operation of the logic block in response to the test vector.

8. Scan test circuitry as defined in claim 7, wherein the controller is configured to scan test the first disturbing element in an active state in response to a first test vector and to scan test the first disturbing element in an inactive state in response to a second test vector.

9. Scan test circuitry as defined in claim 6, wherein the controller is configured to individually scan test each of the disturbing elements in active and inactive states.

10. Scan test circuitry as defined in claim 6, wherein the controller is configured to:
  load into the flip-flops, with all disturbing elements inhibited, a first test vector for scan testing a first disturbing element in an active state;
  enable the first disturbing element with all other disturbing elements inhibited;
  observe operation of the logic block in response to the first test vector;
  load into the flip-flops, with all disturbing elements inhibited, a second test vector for scan testing the first disturbing element in an inactive state;
  enable the first disturbing element with all other disturbing elements inhibited; and
  observe operation of the logic block in response to the second test vector.

11. Scan test circuitry as defined in claim 6, wherein the controller is further configured to perform a scan test with all disturbing elements inhibited by the respective inhibiting circuits.

12. Scan test circuitry as defined in claim 6, wherein at least one of the inhibiting circuits is configured to inhibit a disturbing element that affects a clock signal supplied to at least one of the flip-flops.

13. Scan test circuitry as defined in claim 6, wherein at least one of the inhibiting circuits is configured to inhibit a disturbing element that affects a reset signal supplied to at least one of the flip-flops.

14. Scan test circuitry as defined in claim 6, wherein at least one of the inhibiting circuits is configured to inhibit a disturbing element that affects at least one input from the scan test circuitry to the logic block.

15. Scan test circuitry as defined in claim 6, wherein at least one of the inhibiting circuits is configured to inhibit a disturbing element that affects at least one output of the logic block to the scan test circuitry.

16. In an integrated circuit having a plurality of flip-flops operable as a register in a scan test mode and a logic block including elements capable of disturbing a scan test, each of the elements having a type, a scan test method comprising:
  (a) inhibiting all of the disturbing elements except a plurality of disturbing elements of a selected type;
  (b) performing a scan test of the disturbing elements of the selected type;
  (c) repeating steps (a) and (b) for each type of disturbing element in the logic block;
  (d) performing a scan test of the logic block with all of the disturbing elements inhibited.

17. A scan test method as defined in claim 16, wherein performing a scan test of the selected disturbing elements comprises loading into the flip-flops a first test vector for scan testing the selected disturbing elements in an active state and observing operation of the logic block in response to the first test vector.

18. A scan test method as defined in claim 17, wherein performing a scan test of the selected disturbing elements further comprises loading into the flip-flops a second test vector for scan testing the selected disturbing elements in an inactive state and observing operation of the logic block in response to the second test vector.

19. A scan test method as defined in claim 16, wherein inhibiting all of the disturbing elements except disturbing elements of a selected type comprises inhibiting disturbing elements except those of a type that affects a clock signal supplied to at least one of the flip-flops.

20. A scan test method as defined in claim 16, wherein inhibiting all of the disturbing elements except disturbing elements of a selected type comprises inhibiting disturbing elements except those of a type that affects a reset signal supplied to at least one of the flip-flops.

21. A scan test method as defined in claim 16, wherein inhibiting all of the disturbing elements except disturbing elements of a selected type comprises inhibiting disturbing elements except those of a type that affects a locking element coupled to at least one of the flip-flops.

22. A scan test method as defined in claim 16, wherein inhibiting all of the disturbing elements except disturbing elements of a selected type comprises inhibiting disturbing elements except those of a type that affects an input to the logic block from at least one of the flip-flops.

23. A scan test method as defined in claim 16, wherein inhibiting all of the disturbing elements except disturbing elements of a selected type comprises inhibiting disturbing elements except those of a type that affects an output of the logic block to at least one of the flip-flops.

24. A scan test method as defined in claim 16, wherein performing a scan test of disturbing elements of a selected type comprises inhibiting the selected disturbing elements to load a test vector into the flip-flops and enabling the selected disturbing element to observe operation of the logic block in response to the test vector.

25. A scan test method as defined in claim 16, wherein performing a scan test of the selected disturbing elements comprises scan testing the selected disturbing elements in active and inactive states.

26. A scan test method as defined in claim 16, wherein performing a scan test of the selected disturbing element comprises:
  loading into the flip-flops, with all disturbing elements inhibited, a first test vector for scan testing a first disturbing element in an active state;
  enabling the first disturbing element with all other disturbing elements inhibited;
  observing operation of the logic block in response to the first test vector;
  loading into the flip-flops, with all disturbing elements inhibited, a second test vector for scan testing the first disturbing element in an inactive state;
  enabling the first disturbing element with all other disturbing elements inhibited; and
  observing operation of the logic block in response to the second test vector.

* * * * *

UNITED STATES PATENT AND TRADEMARK OFFICE
CERTIFICATE OF CORRECTION

PATENT NO. : 6,938,194 B2
DATED : August 30, 2005
INVENTOR(S) : Jacques Prunier

It is certified that error appears in the above-identified patent and that said Letters Patent is hereby corrected as shown below:

Column 1,
Lines 46-47, should read -- each mulitiplexer Mi is connected to the input Di of same rank. A first input terminal of each multiplexer Mi is connected to --.
Line 66, should read -- TD3, TD2, and TD1 are successively presented to terminal SI at the --.

Column 3,
Line 1, should read -- circuit operation. When the circuit is tested, signal TEST is --.

Column 4,
Line 22, should read -- before sequentially reading the data contained in the register. --.
Line 55, should read -- elements bearing the same references in Fig. 3, connected in --.

Column 5,
Line 55, should read -- do not include an error that maintains signal EN1 active. --.

Column 6,
Line 23, should read -- test register. Vector TD6, TD5, and TD4 is chosen to give the --.
Line 42, should read -- and FF1 and provided to input terminals I3, I2, and I1 from time t3 --.

Column 7,
Line 42, should read -- readily occur to those skilled in the art. Disturbing elements --.
Line 44, should read -- There are many types of elements disturbing the scan test, --.

UNITED STATES PATENT AND TRADEMARK OFFICE
CERTIFICATE OF CORRECTION

PATENT NO. : 6,938,194 B2
DATED : August 30, 2005
INVENTOR(S) : Jacques Prunier

It is certified that error appears in the above-identified patent and that said Letters Patent is hereby corrected as shown below:

Column 8,
Line 2, should read -- a single logic block and three flip-flops, but --.

Signed and Sealed this

Eighth Day of November, 2005

JON W. DUDAS
*Director of the United States Patent and Trademark Office*